United States Patent
Ruppert

(10) Patent No.: US 12,185,504 B2
(45) Date of Patent: Dec. 31, 2024

(54) ELECTRICAL CIRCUIT DEVICE, ELECTRICAL DRIVE DEVICE AND MOTOR VEHICLE

(71) Applicant: AUDI AG, Ingolstadt (DE)

(72) Inventor: Daniel Ruppert, Lenting (DE)

(73) Assignee: AUDI AG, Ingolstadt (DE)

( * ) Notice: Subject to any disclaimer, the term of this patent is extended or adjusted under 35 U.S.C. 154(b) by 199 days.

(21) Appl. No.: 18/169,090

(22) Filed: Feb. 14, 2023

(65) Prior Publication Data
US 2023/0262943 A1    Aug. 17, 2023

(30) Foreign Application Priority Data
Feb. 15, 2022    (DE) .................. 102022103471.2

(51) Int. Cl.
H05K 7/20    (2006.01)
H05K 1/18    (2006.01)

(52) U.S. Cl.
CPC .......... *H05K 7/20509* (2013.01); *H05K 1/18* (2013.01); *H05K 7/209* (2013.01); *H05K 2201/10522* (2013.01); *H05K 2201/1059* (2013.01)

(58) Field of Classification Search
None
See application file for complete search history.

(56) References Cited

U.S. PATENT DOCUMENTS

| | | | |
|---|---|---|---|
| 9,312,192 B2* | 4/2016 | Horio | H01L 24/18 |
| 9,906,157 B2* | 2/2018 | Tan | H01L 23/053 |
| 9,917,031 B2* | 3/2018 | Soyano | H01L 23/49811 |
| 10,285,279 B2* | 5/2019 | Sekino | H05K 7/209 |
| 11,101,241 B2* | 8/2021 | Nakamura | H01L 25/0655 |
| 11,937,413 B2* | 3/2024 | Reiter | H01L 23/473 |
| 2011/0299253 A1* | 12/2011 | Nabilek | H05K 3/325 |
| | | | 361/728 |
| 2012/0008286 A1* | 1/2012 | Suzuki | B60L 15/007 |
| | | | 361/728 |

(Continued)

FOREIGN PATENT DOCUMENTS

| | | |
|---|---|---|
| DE | 102010022562 A1 | 12/2011 |
| DE | 102019132685 A1 | 6/2021 |

(Continued)

*Primary Examiner* — Xanthia C Relford
(74) *Attorney, Agent, or Firm* — Seed IP Law Group LLP

(57) ABSTRACT

An electrical circuit device comprises at least one first power electronics module, at least one second power electronics module, a circuit board and a supporting structure, wherein the power electronics modules each lie by a contact side against an associated contact surface of the supporting structure and have one or more terminal pins connected to the circuit board on and/or next to a connection side situated opposite the contact side, wherein the first power electronics module has a lesser thickness between the contact side and the connection side than the second power electronics module, wherein the contact surface against which the contact side of the first power electronics module bears has a lesser distance from the circuit board than the contact surface against which the contact side of the second power electronics module bears, and/or wherein the terminal pins of the first power electronics module are longer than the terminal pins of the second power electronics module.

12 Claims, 4 Drawing Sheets

(56) References Cited

U.S. PATENT DOCUMENTS

| | | | |
|---|---|---|---|
| 2012/0241953 A1* | 9/2012 | Yamada | H05K 7/20509 |
| | | | 257/737 |
| 2014/0210067 A1* | 7/2014 | Takamiya | H01L 23/049 |
| | | | 257/698 |
| 2016/0308481 A1 | 10/2016 | Lei et al. | |
| 2019/0296658 A1* | 9/2019 | Chung | H02M 7/003 |
| 2020/0022279 A1* | 1/2020 | Adam | H05K 1/184 |
| 2021/0014999 A1* | 1/2021 | Denk | H05K 7/20927 |
| 2021/0210880 A1* | 7/2021 | Fukakusa | H05K 7/209 |
| 2022/0046830 A1* | 2/2022 | Gradinger | H01L 23/473 |
| 2022/0095493 A1* | 3/2022 | Blanchard St-Jacques | |
| | | | H05K 1/0231 |
| 2022/0225547 A1* | 7/2022 | Müller | H05K 7/20872 |
| 2022/0287209 A1* | 9/2022 | Reiter | H01L 25/0655 |
| 2023/0238374 A1* | 7/2023 | Schmenger | H01L 24/73 |
| | | | 257/712 |

FOREIGN PATENT DOCUMENTS

| | | |
|---|---|---|
| EP | 2804212 A1 | 11/2014 |
| WO | WO 2022002464 A1 | 1/2022 |

\* cited by examiner

ELECTRICAL CIRCUIT DEVICE, ELECTRICAL DRIVE DEVICE AND MOTOR VEHICLE

BACKGROUND

Technical Field

Embodiments of the invention relate to an electrical circuit device comprising at least one first power electronics module, at least one second power electronics module, a circuit board and a supporting structure. Furthermore, embodiments of the invention relate to an electrical drive device and a motor vehicle.

Description of the Related Art

Electrical circuit devices may have different types of power electronics modules, and each of them can carry out different functions, such as functions during the operation of an electrical machine. Different types of power electronics modules can have different layouts, owing in part to the functions to be provided by them.

In order to form the electrical circuit device, such power electronics modules can be arranged for example on a common supporting structure. An electrical connection of multiple power electronics modules in the electrical circuit device can be done by the use of electrical wiring, but also by one or more interconnected circuit boards. For the connecting of different types of power electronics modules having different layouts, an electrical connection, especially one using circuit boards, is generally more costly than one for power electronics modules of the same type. In the prior art, various interconnections are known for power electronics modules of the same design as well as power electronics modules of different design.

EP 2 804 212 A1 describes a semiconductor component consisting of a plurality of semiconductor modules. Each semiconductor module here forms a half bridge, which are connected to each other to form a three-phase inverter circuit. For this, the semiconductor modules each have a plurality of terminals which are connected to a circuit board and to multiple terminal plates for the electrical connecting of the semiconductor modules. The power electronics modules are identical in design and are arranged on a cooling body with one housing side situated opposite the terminals.

DE 10 2010 022 562 A1 there is known an electrical power electronics module for mounting on a circuit board. The power electronics module has a first side for mounting on a surface of a heat sink and a second side with electrical connection elements. The electrical power electronics module is connected to the circuit board and to the heat sink by at least one dowel-like fastening element, which extends through corresponding openings of the circuit board, the power electronics module, and the heat sink.

DE 10 2019 132 635 A1 discloses an electrical circuit arrangement comprising an exciter circuit and an inverter circuit. The inverter circuit is arranged on a first supporting element and the exciter circuit on a second supporting element, the second supporting element being connected to an intermediate circuit capacitor of the inverter circuit, arranged on the first supporting element.

BRIEF SUMMARY

Some embodiments include an electrical circuit device comprising at least one first power electronics module, at least one second power electronics module, a circuit board and a supporting structure, wherein the power electronics modules each lie by a contact side against an associated contact surface of the supporting structure and have one or more terminal pins connected to the circuit board on and/or next to a connection side situated opposite the contact side, wherein the first power electronics module has a lesser thickness between the contact side and the connection side than the second power electronics module.

Some embodiments include an improved electrical circuit device making possible an easier mounting of the electrical circuit device especially when the power electronics modules have different thicknesses.

In some embodiments, in an electrical circuit device of the kind mentioned above, the contact surface against which the contact side of the first power electronics module bears has a lesser distance from the circuit board than the contact surface against which the contact side of the second power electronics module bears and/or the terminal pins of the first power electronics module are longer than the terminal pins of the second power electronics module.

An equalizing of the different thickness can thus be achieved in that the contact surface against which the first power electronics module bears against the supporting structure is situated closer to the circuit board than the contact surface against which the thicker second power electronics module bears. In other words, the contact surface of the first power electronics module thus has a lesser distance from the circuit board than the contact surface of the second power electronics module, so that the tips or the ends spaced apart from the connection side of the terminal pins of the first power electronics module and the second power electronics module which stick out from or next to the connection side terminate in particular in a common plane. This makes it possible to connect the terminal pins of the first power electronics module and the second power electronics module to a common circuit board.

In addition or alternatively, the thinner first power electronics module can have longer terminal pins than the thicker second power electronics module. In this way, it is possible for the tips of the terminal pins of the first power electronics module and the second power electronics module sticking out from or next to the connection side to terminate in particular in a common plane. Thus, the different thickness of the power electronics modules can also be at least partly balanced out by a different length of the terminal pins.

Because the thinner first power electronics module has longer terminal pins than the thicker second power electronics module and/or because the contact surface at which the first power electronics module bears against the supporting structure is situated closer to the circuit board than the contact surface at which the thicker second power electronics module bears, it becomes possible to use a single, especially a planar circuit board for connecting the first power electronics module and the second power electronics module. This simplifies the assembly of the electrical circuit device, since a single circuit board can be connected to the terminal pins of both the first power electronics module and the second power electronics module. Thus, one can avoid different circuit boards connected either to the first power electronics module or the second power electronics module.

This reduces the material costs in the manufacture of the electrical circuit device, since one a single circuit board needs to be used. Furthermore, there are no plug connections and no use of cables or other connection means having to connect two separate circuit boards each connected only to the first or the second power electronics module. Furthermore, the development costs are also reduced, since only a single circuit board is required to connect the power electronics modules.

Thanks to the use of a single circuit board, the costs for the production of the circuit board and the surface mounting of components are also reduced. Furthermore, the testing performed on a second circuit board is also unnecessary, so that the production expense can be reduced in this regard.

Moreover, the expense for the manufacture of the electrical circuit device is also reduced, since the individual circuit board can be connected by a simple fastening process to the power electronics modules. This also makes possible production of the electrical circuit device in a highly automated large series production.

The first power electronics module and the second power electronics module can each form and/or contain different circuit components or circuits for different purposes. In particular, the power electronics modules can each contain one or more power semiconductors. The electrical circuit device can also have multiple first power electronics modules and/or multiple second power modules in particular.

Besides having different thickness, the first power electronics module and the second power electronics module can also have other different characteristics. The different layouts of the first power electronics module and the second power electronics module may differ, for example, in terms of the particular circuit realized and in terms of performance and/or cost factors.

The terminal pins of the power electronics modules, which can also be called contacts or contact pins or contacting pins of the power electronics modules, can be arranged on the connection side and stick out in particular from the connection side. It is also possible for the terminal pins or at least some of the terminal pins to be arranged next to the connection side and to stick out to the side across the connection side. The terminal pins can be power terminals and/or control terminals of the power electronics module, depending on the type of the particular power electronics module.

The circuit board is connected to the terminal pins and can connect or hook up the power electronics modules to each other and/or to other parts of the electrical circuit device, such as a driver circuit, a control circuit, and/or further components. It is possible for a driver circuit, a control circuit, and/or at least one further component to be arranged entirely or partly on the circuit board or to be formed entirely or partly by components arranged on the circuit board. The circuit board can also be called a board.

In some embodiments, it can be provided that the circuit board is a printed circuit board. Printed circuit boards can be produced especially economically in the case of a planar design of the circuit board, so that a further cost reduction results in the production of the electrical circuit device.

In some embodiments, it can be provided that the terminal pins are configured as press fit pins. The use of press fit pins as terminal pins of the power electronics module allows a simple fixation of the circuit board, which is pressed onto the press fit pins and thus can be joined to them electrically and mechanically. The circuit board can have in particular the openings associated with the terminal pins, in which the terminal pins engage or through which the terminal pins extend.

Thanks to the equalizing of thickness of the power electronics modules, as described above, an arrangement or fastening of the circuit board on the terminal pins is made possible in a common fastening plane, so that a connection between the circuit board and the terminal pins designed as press fit pins can be easily done by pressing the circuit board onto them. This further reduces the expense and therefore also the costs in the manufacture of the electrical circuit device.

In some embodiments, it can be provided that the supporting structure is configured as a cooling body. The cooling body can be a passive cooling body or a cooling body having a flow of cooling agent, which can be for example a liquid or gaseous cooling agent. By configuring the supporting structure as a cooling body, it becomes possible to carry away the heat produced in the particular power electronics modules during the operation of the electrical circuit device.

In some embodiments, it can be provided that the contact surfaces on one side of the supporting structure are arranged next to each other and/or separated from each other by a section of the supporting structure. When the supporting structure is configured as a cooling body, the side on which the contact surfaces are arranged can be a cooling surface of the cooling body designed to take up the heat.

The contact surfaces can be arranged immediately next to each other, so that the first power electronics module and the second power electronics module can also be arranged immediately next to each other. In an electrical circuit device having more than one first power electronics module and/or more than one second power electronics module, the first power electronics modules and/or the second power electronics modules can be arranged for example in a row on the side of the supporting structure. Thus, the contact surfaces which are in direct or indirect contact with the contact side of the power electronics modules are respectively arranged in a row.

The contact surfaces on the supporting structure can be arranged in particular immediately next to each other or separated by sections of the supporting structure, which protrude in particular in the direction of the circuit board. In this way, the power electronics modules can also lie, for example, laterally against one or more sections of the supporting structure, thus providing a stable mounting of the power electronics module on the supporting structure and/or also possibly a better removal of heat into a supporting structure designed as a cooling body.

In some embodiments, it can be provided that the contact side and the connection side of the power electronics module are each one side surface of a housing of the respective power electronics module. The contact side can be configured in particular planar and/or thermally conductive, for example as a metal surface. Between the contact side and the contact surface on the supporting structure there can be arranged a thermally conductive medium, such as a thermal conduction paste, a gap pad, or the like, especially when the supporting structure is designed as a cooling body. The connection side, situated opposite the contact side, can be spaced apart in particular from the circuit board, when the circuit board is fastened to the terminal pins, so that each time a gap remains between the circuit board and the connection sides of the power electronics module.

For the housing of the power electronics module it can be provided in some embodiments that the housing of the first power electronics module is formed at least partly by a gel casting compound and a frame and/or that the housing of the second power electronics module is formed at least partly by a mold material, especially an epoxy casting compound and/or a urethane casting compound. The different layouts of the housing for the first power electronics module and the second power electronics module may be instrumental in the power electronics modules having a different thickness.

The use of a different design of housing for the first power electronics module and the second power electronics module enables a cost-favorable manufacture of the electrical circuit device, since the respective layout of the housing of the power electronics module can be chosen in dependence on the particular function, the power being transformed, and/or further attributes and/or operating parameters of the power electronics module. Thanks to the balancing out of thickness, there is no need for a uniform design of all the power electronics modules with an identical or equally dimensioned housing.

In some embodiments, it can be provided that the first power electronics module forms an exciter circuit or is part of an exciter circuit and/or the second power electronics module forms an inverter circuit or is part of an inverter circuit, especially a multiphase one. The reverse arrangement or realization of an exciter circuit and an inverter circuit is also possible.

The electrical circuit device can comprise, in particular, a first power electronics module, designed as an exciter circuit, and multiple second power electronics modules, especially three power electronics modules, forming in particular a three-phase inverter circuit. The first power electronics module can comprise a full bridge, a quasi-full bridge, or a comparable circuit for energizing an exciter winding of an electrical machine. In particular, the first power module can comprise for this one or more power semiconductors, for example bipolar transistors made of silicon with insulating gate (IGBT) and/or one or more diodes.

The second power electronics modules can be designed for example as half bridges, so that the inverter circuit formed from the second power electronics modules when using three power electronics modules is a three-phase inverter, for example, especially a B6 bridge. For this, the second power modules can comprise in particular one or more power semiconductors forming the half bridges, such as one or more metal oxide semiconductor field-effect transistors (MOSFET) made from silicon carbide.

For an electrical drive device in some embodiments it is proposed that it comprises an electrical circuit device as described herein and an electrical machine connected to the electrical circuit device.

The electrical machine can be designed in particular as an externally excited electrical machine. In particular, the first power electronics module can form an exciter circuit or be part of an exciter circuit and the second power electronics module or the second power electronics modules can form an inverter circuit or be part of such an inverter circuit, especially a multiphase one. The first power electronics module can be connected accordingly to an exciter winding of the electrical machine, such as a rotor winding. The second power electronics module can be connected for example to a stator winding of the electrical machine.

For a motor vehicle as described herein it is proposed that it comprises an electrical drive device as described herein.

All of the benefits and embodiments described above in regard to the electrical circuit device also hold accordingly for the electrical drive device and the electrical motor vehicle, and vice versa. The benefits and embodiments which have been described in regard to the electrical drive device apply accordingly to the motor vehicle, and vice versa.

BRIEF DESCRIPTION OF THE SEVERAL VIEWS OF THE DRAWINGS

Further benefits and details will emerge from the following described embodiments and the drawings.

DETAILED DESCRIPTION

Figure 1:
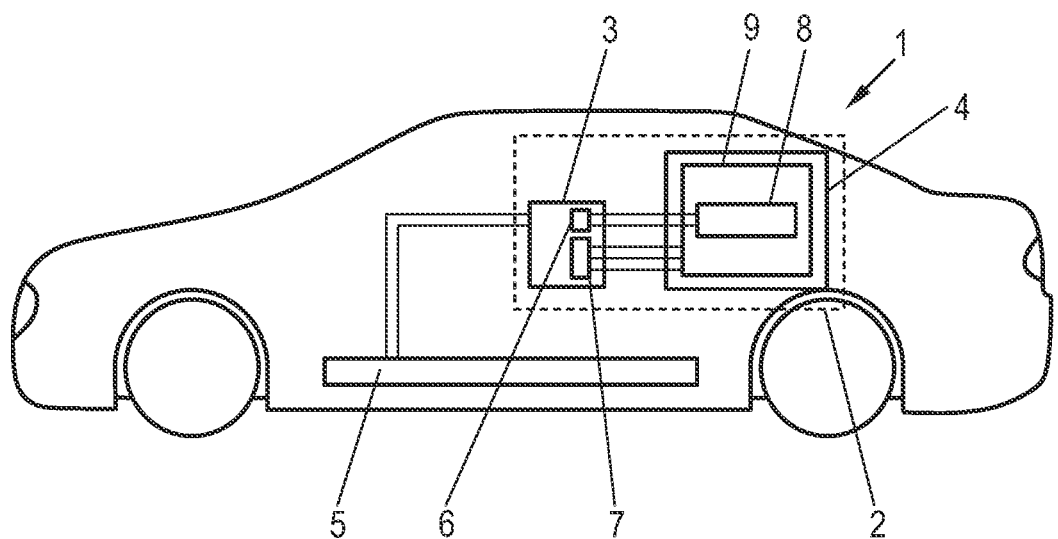
FIG. 1 shows an embodiment of a motor vehicle comprising an electrical drive device.

FIG. 1 shows an embodiment of a motor vehicle 1. The motor vehicle 1 comprises an electrical drive device 2, while the electrical drive device 2 comprises an electrical circuit device 3 and an electrical machine 4 connected to the electrical circuit device 3. The electrical machine 4 is designed as an externally excited electrical machine, such as an externally excited synchronous machine, and it forms an electric traction motor of the motor vehicle 1.

In order to supply the electrical machine 4 with electrical energy and/or to take up energy recuperated through the electrical machine 4, the motor vehicle 1 comprises an energy accumulator 5, which is designed for example as a traction battery. The energy accumulator 5 is connected to the electrical circuit device 3, and the electrical circuit device 3 is designed to operate the electrical machine 4.

The electrical circuit device 3 comprises at least one first power electronics module 6 and one or more second power electronics modules 7. The first power electronics module 6 forms an exciter circuit, by which a rotor or exciter circuit 8 of the electrical machine 4 can be energized. The second power electronics modules 7 form an inverter, especially a three-phase inverter, by which a stator winding 9 of the electrical machine 4 is energized. In this way, the electrical machine 4 can be operated via the electrical circuit device 3 in a motor operation, during which the inverter formed by the second power module 7 transforms a direct current taken from the energy accumulator 5 into an alternating current for energizing the stator winding 9. Furthermore, the electrical circuit device 3 in a generator operation of the electrical machine 4 can also generate a direct current for charging the energy accumulator 5 from an alternating current generated by the electrical machine 4.

Figure 2:
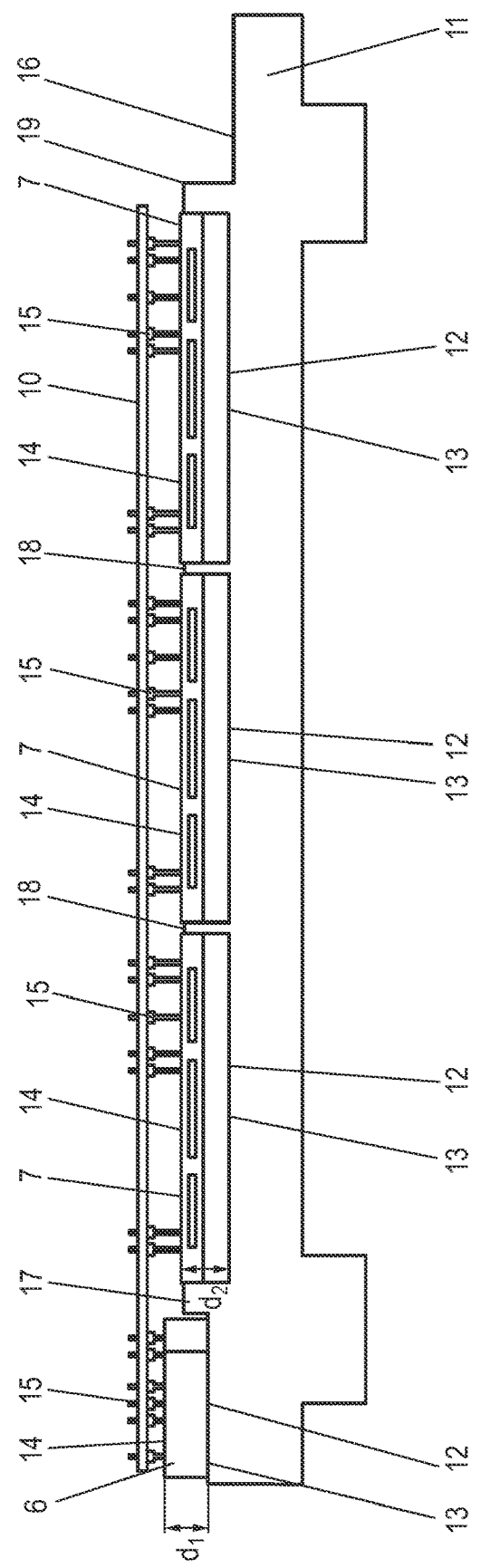
FIG. 2 shows a first embodiment of an electrical circuit device.

FIG. 2 shows an embodiment of the electrical circuit device 3. The electrical circuit device 3 comprises a first power electronics module 6 and three second power electronics modules 7. The first power electronics module 6 forms an exciter circuit, configured for example as a half bridge or quasi-half bridge by which the rotor winding 8 of the electrical machine 4 can be energized. For this, the power electronics module can comprise for example two half bridges or two quasi-half bridges, each made from a transistor and a diode. The switching elements of the first power semiconductor module 6 can be designed as power semiconductors, especially as bipolar transistors made of silicon with insulating gate (IGBT).

The second power electronics modules 7 are each formed as a half bridge module, the three power electronics modules 7 forming an inverter, especially a B6 bridge. The second power modules may comprise two power semiconductor switching elements apiece, such as metal oxide semiconductor field-effect transistors (MOSFET) made from silicon carbide.

The electrical circuit device 3 furthermore comprises a planar circuit board 10, which is designed as a printed circuit board, and a supporting structure 11. The power electronics modules 6, 7 are each arranged lying by one contact side 12 against an associated contact surface 13 of the supporting structure 11. The power electronics modules 6, 7 can each be fixed to the supporting structure 11 by one or more screw connections or comparable fastening means.

The power electronics modules 6, 7 furthermore have a connection side 14 situated opposite the contact side 12. Moreover, the power electronics modules 6, 7 each comprise multiple terminal pins 15, which are arranged on or next to the connection side 14 and stick out at least for a portion beyond the connection side 14. The power electronics modules 6, 7 are connected to the circuit board 10 by the terminal pins 15. The circuit board 10 is situated at a distance from the connection sides 14 of the power electronics modules 6, 7, so that a gap remains between the connection sides 14 and the circuit board 10 each time.

The first power electronics module 6 has a thickness $d_1$ between the contact side 12 and the connection side 14 which is less than the thickness $d_2$ between the contact side 12 and the connection side 14 of the second power electronics module 7. In order to balance out the different thicknesses $d_1$, $d_2$ of the power electronics module 7, the contact surface 13 against which the contact side 12 of the first power electronics module 6 bears is situated at a lesser distance from the circuit board 10 than the contact surface 13 against which the contact sides 12 of the second power electronics module 7 bear.

The contact surfaces 13 of the first power electronics module 6 and the second power electronics module 7 thus have an offset in regard to the direction of arrangement of the power electronics modules 6, 7. This makes it possible to connect the circuit board 12 to the terminal pins 15 in one common plane 8. In particular, thanks to the equalizing of the offset between the contact surfaces 13, the tips of the terminal pins 15 or their ends facing away from the particular connection side 14 are situated in a common, planar plane and thus make possible the connecting to the planar circuit board 10.

The terminal pins 15 are each designed as press fit pins, so that the circuit board 10 when assembling the electrical circuit device 3 is pressed onto the terminal pins 15 and thus can be connected to them electrically and mechanically. The circuit board 10 has openings associated with the terminal pins 15, in which the terminal pins 15 engage for a portion when pressed onto them or through which the terminal pins 15 extend for a portion after being pressed on. This enables a simple mounting and contacting of the circuit board 10 and the power electronics modules 6, 7, so that a simple manufacture of the electrical circuit device 3 results.

The supporting structure 11 in the present embodiment is designed as a cooling body, through which a cooling medium can flow. For this, the cooling body 11 may be connected by multiple ports to a cooling circuit, especially a cooling circuit of the motor vehicle 1. The power electronics modules 6, 7 can be arranged on one side 16 of the supporting structure 11 configured as a cooling surface to take up heat, and each time between the contact sides 12 of the power electronics modules 6, 7 and the side 16 or the contact surfaces 13 of the supporting structure 11 there can be arranged for example a thermally conductive medium, such as a thermal conduction paste, a gap pad, or the like.

The contact surfaces 13 of the supporting structure 11 are arranged in a row next to each other on the side 16. The contact surface 13 against which the contact side 12 of the first power electronics module 6 bears is separated by a section 17 of the supporting structure 11 from the neighboring contact surface 13 on which the contact side 12 of a second power electronics module 7 is arranged. The contact surfaces 13 against which the contact sides 12 of the second power electronics module 7 bear are also separated each time by a further section 18 of the supporting structure 11.

At the right edge of the third contact surface 13 in FIG. 2 there can be provided an additional section 19 of the supporting structure 11, enclosing at least at the edge the second power electronics module 7 situated at the end of the row, so that a stable arrangement of the second power electronics module 7 and/or a better removal of heat from the power electronics modules 7 into the supporting structure 11 designed as a cooling body is made possible.

Figure 3:
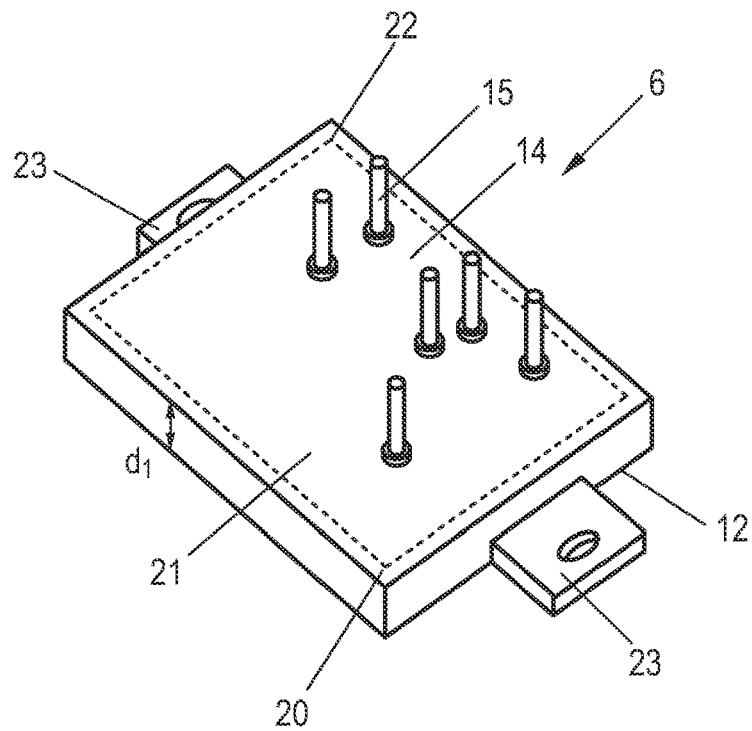
FIG. 3 shows a perspective detail view of the first power electronics module of the electrical circuit device.

FIG. 3 shows a perspective detailed view of the first power electronics module 6. The first power electronics module 6 comprises a housing 20, which is formed by a gel casting compound 21 inside a frame 22, shown by hatching. The first power electronics module 6 comprises multiple terminal pins 15, which stick out from the connection side 14. For this, the terminal pins 15 can likewise be partially encased in the gel casting compound 21 and stick out from it across the connection side 14. The terminal pins 15 of the first power electronics module 6 are designed or wired as power terminals and as control terminals. Furthermore, the power electronics module 6 comprises two fastening sections 23 by which the power electronics module 6 can be screwed together with the supporting structure 11.

The depicted layout of the power electronics module 6 is merely an example, and one or more first power electronics modules 6 having a different shape of housing 20 or having more or fewer connection sections 23, more or fewer terminal pins 15 and/or additional fastening and/or contacting sections or the like can also be used in the electrical circuit device 3.

Figure 4:
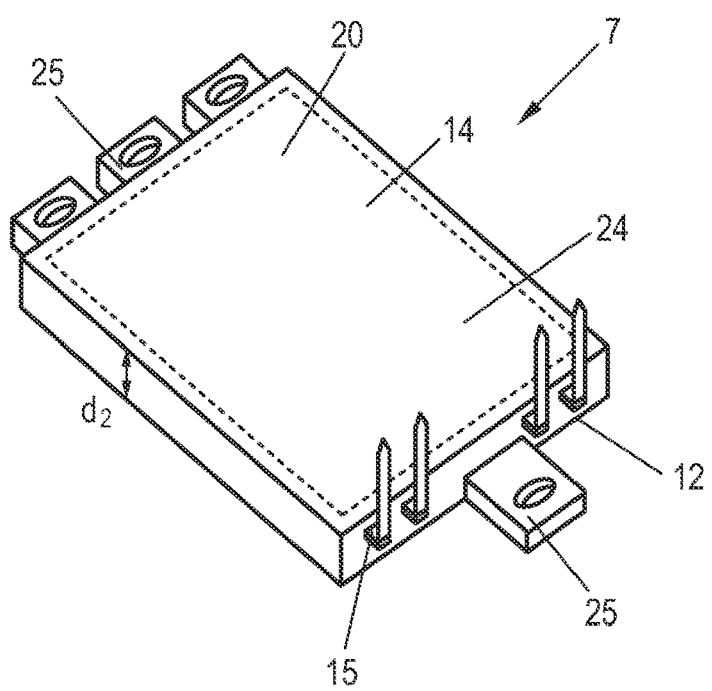
FIG. 4 shows a perspective detail view of the second power electronics module of the electrical circuit device.

FIG. 4 shows a perspective detailed view of the second power electronics module 7. The second power electronics module 7 comprises a housing 20, which is formed at least partly by a mold material 24, especially an epoxy casting compound and/or a urethane casting compound. Due to the different method of fabrication and the different function of the power electronics module 7, the power electronics module 7 or the housing 20 of the power electronics module 7 has a larger thickness $d_2$ between the contact side 12 and the connection side 14 than the thickness $d_1$ of the first power electronics module 6.

The second power electronics module 7 comprises multiple contact lugs 25 and multiple terminal pins 15 configured or wired as control terminals, which stick out to the side next to the connection side 14 and which can be fastened and electrically connected by the power electronics module 7 to the circuit board 10, as shown in FIG. 2. The contact lugs 25 are configured or wired as power terminals of the second power electronics module 7 and can form a phase terminal for an alternating current as well as multiple direct current terminals.

The depicted layout of the power electronics module 7 is likewise an example, and the second power electronics module 7 can also have in particular a different number of terminal pins 15 and/or contact lugs 25. Furthermore, the second power electronics module 7 can also have one or more fastening sections 23 or the like, for example in order to make possible a screwing together with the supporting structure 11.

Figure 5:
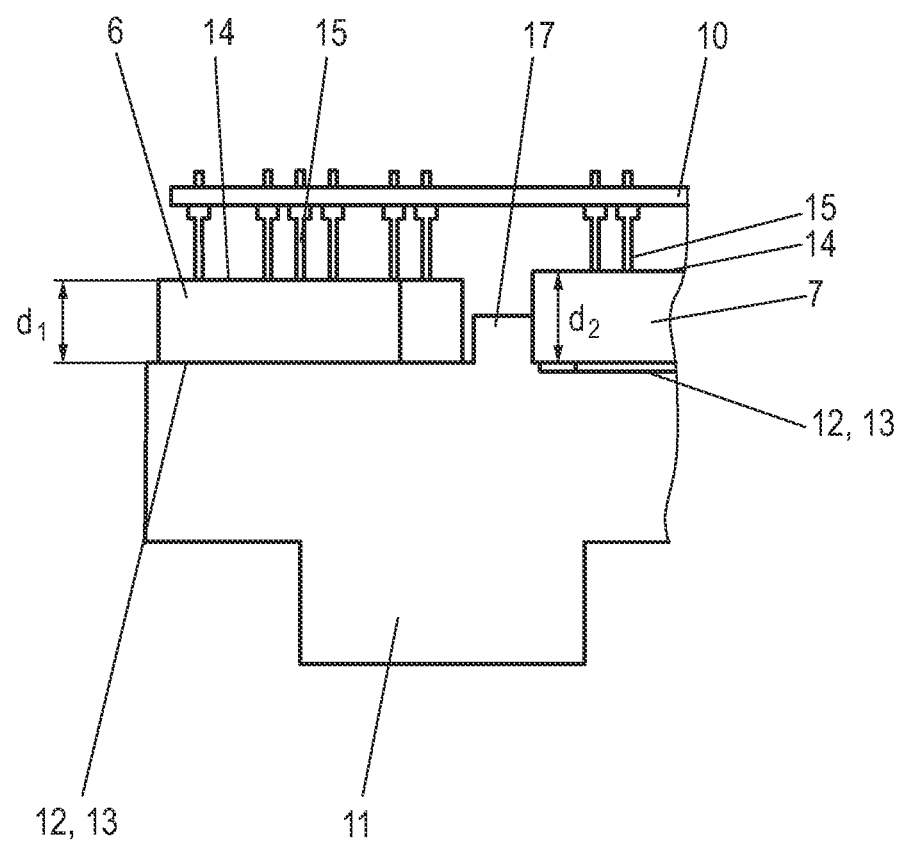
FIG. 5 shows a second embodiment of an electrical circuit device.

FIG. 5 shows a second embodiment of an electrical circuit device 3. The layout basically corresponds to the first embodiment of the electrical circuit device 3, yet it has the difference that the different thicknesses $d_1$, $d_2$ of the power electronics modules 6, 7 are balanced out in that the first power electronics module 6 has longer terminal pins 15.

The contact surfaces 13 against which the power electronics modules 6, 7 bear on the supporting structure 11 each time have the same distance from the circuit board 10 in the second embodiment, or no offset in relation to the direction of arrangement of the power electronics modules 6, 7. Alternatively, it is possible for the contact surfaces 13 to also have different distances from the circuit board 10, in particular for the contact surface 13 against which the first power electronics module 6 bears on the supporting structure 11 to be situated closer to the circuit board 10, so that the different thicknesses $d_1$, $d_2$ are equalized by a combination of the different distances between the contact surfaces 13 and the circuit board 10 and by the longer terminal pins 15 of the first power electronics module 6.

German patent application no. 10 2022 103471.2, filed Feb. 15, 2022, to which this application claims priority, is hereby incorporated herein by reference in its entirety.

Aspects of the various embodiments described above can be combined to provide further embodiments. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. An electrical circuit device, comprising:
    at least one first power electronics module,
    at least one second power electronics module,
    a circuit board, and
    a supporting structure,
    wherein the power electronics modules each lie by a contact side against an associated contact surface of the supporting structure and have one or more terminal pins connected to the circuit board on and/or next to a connection side situated opposite the contact side,
    wherein the first power electronics module has a lesser thickness between the contact side and the connection side than the second power electronics module,
    wherein the contact surface against which the contact side of the first power electronics module bears has a lesser distance from the circuit board than the contact surface against which the contact side of the second power electronics module bears, and/or
    wherein the terminal pins of the first power electronics module are longer than the terminal pins of the second power electronics module.

2. The electrical circuit device according to claim 1, wherein the circuit board is a printed circuit board.

3. The electrical circuit device according to claim 1, wherein the terminal pins are configured as press fit pins.

4. The electrical circuit device according to claim 1, wherein the supporting structure is configured as a cooling body.

5. The electrical circuit device according to claim 1, wherein the contact surfaces on one side of the supporting structure are arranged next to each other and/or separated from each other by a section of the supporting structure.

6. The electrical circuit device according to claim 1, wherein the contact side and the connection side of the power electronics module are each one side surface of a housing of the respective power electronics module.

7. The electrical circuit device according to claim 6, wherein the housing of the first power electronics module is formed at least partly by a gel casting compound and a frame and/or the housing of the second power electronics module is formed at least partly by a mold material.

8. The electrical circuit device according to claim 7, wherein the mold material is an epoxy casting compound and/or a urethane casting compound.

9. The electrical circuit device according to claim 1, wherein the first power electronics module forms an exciter circuit or is part of an exciter circuit and/or the second power electronics module forms an inverter circuit or is part of an inverter circuit.

10. The electrical circuit device according to claim 9, wherein the inverter circuit is a multiphase inverter circuit.

11. An electrical drive device comprising an electrical circuit device according to claim 1 and an electrical machine connected to the electrical circuit device.

12. A motor vehicle comprising an electrical drive device according to claim 11.

* * * * *